(12) United States Patent
Lee et al.

(10) Patent No.: US 9,774,008 B2
(45) Date of Patent: Sep. 26, 2017

(54) OLED DISPLAY DEVICE INCLUDING TRANSFLECTIVE LAYER AND METHOD OF MANUFACTURING THE SAME

(71) Applicant: Samsung Display Co., Ltd., Yongin (KR)

(72) Inventors: Dong Min Lee, Anyang-si (KR); Hyun Eok Shin, Gwacheon-si (KR); Chan Woo Yang, Siheung-si (KR); Su Kyoung Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 93 days.

(21) Appl. No.: 14/698,265

(22) Filed: Apr. 28, 2015

(65) Prior Publication Data
US 2016/0149161 A1    May 26, 2016

(30) Foreign Application Priority Data
Nov. 24, 2014  (KR) .......................... 10-2014-0164445

(51) Int. Cl.
*H01L 29/08* (2006.01)
*H01L 51/52* (2006.01)

(52) U.S. Cl.
CPC ...... *H01L 51/5271* (2013.01); *H01L 51/5265* (2013.01); *H01L 2251/301* (2013.01); *H01L 2251/558* (2013.01)

(58) Field of Classification Search
CPC ........................ H01L 51/5271; H01L 51/5265
See application file for complete search history.

(56) References Cited

U.S. PATENT DOCUMENTS

| 2003/0201716 A1* | 10/2003 | Yamazaki | H01L 27/322 313/506 |
| 2010/0215903 A1* | 8/2010 | Tonar | B60R 1/084 428/141 |
| 2012/0097928 A1* | 4/2012 | Kim | H01L 27/3267 257/40 |
| 2014/0191216 A1* | 7/2014 | Matsumoto | H01L 51/5284 257/40 |

FOREIGN PATENT DOCUMENTS

KR   10-2012-0056505   6/2012
KR   10-2013-0091204   8/2013
(Continued)

OTHER PUBLICATIONS

Titanium Refractive Index:http://refractiveindex.info/?shelf=main&book=Ti&page=Werner-DFT.*

(Continued)

*Primary Examiner* — Matthew Gordon
(74) *Attorney, Agent, or Firm* — H.C. Park & Associates, PLC

(57) ABSTRACT

An organic light-emitting diode (OLED) display device includes a substrate; a transistor device disposed on the substrate; a first electrode electrically connected to the transistor device; an organic light-emitting layer disposed on the first electrode; and a second electrode disposed on the organic light-emitting layer. The OLED display device further includes a transflective layer contacting a lower surface of the first electrode and having a relatively higher refractive index than the first electrode.

8 Claims, 10 Drawing Sheets

(56) References Cited

FOREIGN PATENT DOCUMENTS

| KR | 10-2013-0133592 | 12/2013 |
| KR | 10-2014-0039840 | 4/2014 |
| KR | 10-2014-0048796 | 4/2014 |

OTHER PUBLICATIONS

Aluminum Refractive Index: http://refractiveindex.info/?shelf=main&book=Al&page=McPeak.*
Gold Refractive Index: http://refractiveindex.info/?shelf=main&book=Au&page=Lemarchand.*
ITO Refractive Index: http://refractiveindex.info/?shelf=other&book=In2O3-SnO2&page=Konig.*

* cited by examiner

Doping

OLED DISPLAY DEVICE INCLUDING TRANSFLECTIVE LAYER AND METHOD OF MANUFACTURING THE SAME

CROSS REFERENCE TO RELATED APPLICATION

This application claims priority from and the benefit of Korean Patent Application No. 10-2014-0164445, filed on Nov. 24, 2014, which is hereby incorporated by reference for all purposes as if fully set forth herein.

BACKGROUND

Field

Exemplary embodiments relate to an organic light-emitting diode (OLED) display device and a method of manufacturing the same.

Discussion of the Background

Existing display devices have largely been replaced with thin, flat panel display devices such as liquid crystal display (LCD) devices or organic light-emitting diode (OLED) display devices.

An OLED display device, emits light in response to the transition of the excitons formed in an organic light-emitting layer from an excited state to a ground state, and the light may be emitted to the outside of the OLED display device through multiple organic and inorganic layers. However, due to the refractive index of materials used in the OLED display device, a considerable amount of light may be lost in an absorption layer and a reflective layer of the OLED display device. Also, even though front transmissivity is one of the most important factors for determining optical efficiency, the OLED display device generally has low front transmissivity. Accordingly, a structure or a method is needed to improve the optical efficiency of the OLED display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin organic light-emitting diode (OLED) display device.

Exemplary embodiments of the invention also provide a method of manufacturing an OLED display device, which can improve the efficiency of production.

Additional features of the invention will be set forth in the description which follows, and in part will be apparent from the description, or may be learned by practice of the invention.

According to an exemplary embodiment of the invention an organic light-emitting diode (OLED) display device includes: a substrate; a transistor device configured to be disposed on the substrate; a first electrode configured to be electrically connected to the transistor device; an organic light-emitting layer configured to be disposed on the first electrode; and a second electrode configured to be disposed on the organic light-emitting layer. The OLED display device further includes a transflective layer configured to contact a bottom surface of the first electrode and have a relatively higher refractive index than the first electrode.

The refractive indexes of the transflective layer and the first electrode may have a difference of 0.5 or greater.

The transflective layer may comprise a material having a refractive index of 2.5 or higher.

The transflective layer may comprise at least one material selected from the group consisting of amorphous silicon (a-Si), polycrystalline silicon (p-Si), and silicon carbide (SiC).

The transflective layer may have a thickness of 50 Å to 200 Å.

The first electrode may have a thickness of 50 Å to 100 Å.

The OLED display device may further comprise: a transparent layer disposed on a lower surface of the transflective layer.

The transparent layer may comprise a same material or materials as the first electrode.

The transparent layer may comprise at least one material selected from the group consisting of indium tin oxide (ITO), tin oxide (SnO), indium zinc oxide (IZO), zinc oxide (ZnO), indium oxide (In2O3), indium gallium oxide (IGO), aluminum zinc oxide (AZO), and zinc gallium oxide (GZO).

According to another exemplary embodiment of the invention, a method of manufacturing an OLED display device includes: forming a transistor device on a substrate; forming a first electrode, which is electrically connected to the transistor device; forming an organic light-emitting layer on the first electrode; and forming a second electrode on the organic light-emitting layer. The method further includes forming a transflective layer that has a relatively higher refractive index than the first electrode at a bottom surface of the first electrode.

The refractive indexes of the transflective layer and the first electrode may have a difference of 0.5 or greater.

The transflective layer may be formed of a material having a refractive index of 2.5 or higher.

The transflective layer may comprise at least one material selected from the group consisting of a-Si, p-Si, and SiC.

The first electrode may have a thickness of 50 Å to 100 Å.

The transflective layer may have a thickness of 50 Å to 200 Å.

According to another exemplary embodiment of the invention an OLED display device, the method includes: forming a transistor device on a substrate; forming a transflective layer and a contact hole, which exposes part of the transistor device therethrough, on the substrate where the transistor device is formed; forming a first electrode, which overlaps the transflective layer and is electrically connected to the transistor device via the contact hole; forming an organic light-emitting layer on the first electrode; and forming a second electrode on the organic light-emitting layer. The transflective layer has a relatively higher refractive index than the first electrode.

The refractive indexes of the transflective layer and the first electrode may have a difference of 0.5 or greater.

The transflective layer may be formed of a material having a refractive index of 2.5 or higher.

The transflective layer may include at least one selected from the group consisting of a-Si, p-Si, and SiC.

The first electrode may have a thickness of 50 Å to 100 Å.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
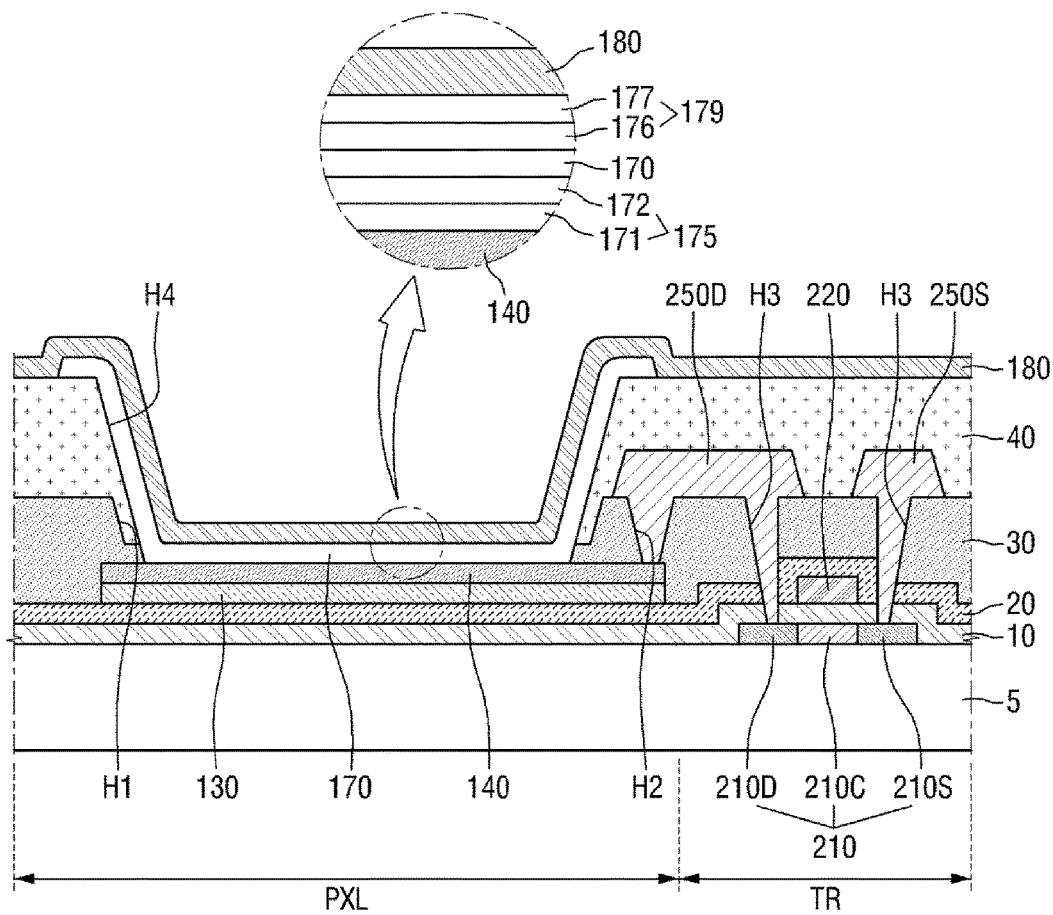
FIG. 1 is a cross-sectional view of an organic light-emitting diode (OLED) display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments of the present invention will be described with reference to the attached drawings.

FIG. 1 is a cross-sectional view of an organic light-emitting diode (OLED) display device according to an exemplary embodiment of the invention.

Referring to FIG. 1, a pixel region PXL and a transistor region TR may be provided on a substrate 5 of an OLED display device 1.

The substrate 5 may be formed of a transparent glass or quartz material having $SiO_2$ as a main ingredient thereof, but the invention is not limited thereto. For example, the substrate 5 may be formed of a transparent polymer material. The polymer material may be an organic insulating material such as polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (TAC), cellulose acetate propionate (CAP), or a combination thereof. In exemplary embodiments of the invention, the substrate 5 may be a flexible substrate formed of a flexible material such as PI.

A buffer layer (not illustrated) may be provided on the substrate 5. The buffer layer may form a flat, smooth surface at the top of the substrate 5, and may prevent the infiltration of impurities. The buffer layer may be formed as a single- or double-layer of silicon nitride and/or silicon oxide.

An active layer 210 may be disposed in the transistor region TR of the substrate 5. The active layer 210 may be formed of a semiconductor including amorphous silicon (a-Si) or polycrystalline silicon (p-Si). The active layer 210 may include a channel region 210C, a source region 210S, and a drain region 210D. The source region 210S and the drain region 210D are provided on both sides of the channel region 210C and may be doped with ion impurities.

A first insulating layer 10 may be disposed on the active layer 210. The first insulating layer 10 may insulate the active layer 210. The first insulating layer 10 may be formed by depositing an organic material or an inorganic material, such as SiNx, $SiO_2$, SiON, $Al_2O_3$, $TiO_2$, $Ta_2O_5$, $HfO_2$, $ZrO_2$, BST and/or PZT. The first insulating layer 10 may be formed by various deposition methods, such as plasma enhanced chemical vapor deposition (PECVD), atmospheric pressure chemical vapor deposition (APCVD), or low pressure chemical vapor deposition (LPCVD). For example, the first insulating layer 10 may be formed by alternately depositing $SiO_2$ with a low refractive index and SiNx with a relatively high refractive index.

A gate electrode 220 may be disposed in the transistor region TR of the first insulating layer 10. The gate electrode 220 may overlap at least part of the active layer 210, and may transmit an electric signal. The gate electrode 220 may be formed as a single- or multi-layer structure including at least one metal selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). For example, the gate electrode 220 may include a first layer including Mo, a second layer disposed on the first layer and including Al, and a third layer disposed on the second layer and including Mo. In a case when the gate electrode 220 is formed as a Mo/Al/Mo triple layer, the Al layer may be a wire or an electrode, and the Mo layers may be a barrier layer.

A second insulating layer 20 may be disposed on the substrate 5 where the gate electrode 220 is formed. The second insulating layer 20 may be formed of a silicon-based insulating material including $SiO_2$, SiNx, or SiON, but is not limited thereto.

A first electrode 140 and a transflective layer 130, which may have different refractive indexes, may be disposed in the pixel region PXL of the second insulating layer 20.

The first electrode 140 may be an anode electrode. The first electrode 140 may include a conductive material with a relatively high work function. For example, the first electrode 140 may include a transparent conductive oxide. The first electrode 140 may include at least one of indium tin oxide (ITO), tin oxide (SnO), indium zinc oxide (IZO), zinc oxide (ZnO), indium oxide ($In_2O_3$), indium gallium oxide (IGO), aluminum zinc oxide (AZO), and zinc gallium oxide (GZO), but is not limited thereto. The first electrode 140 may reduce the difference between the work function of an organic light-emitting layer 170, which is disposed on the first electrode 140, and the work function of the transflective layer 130.

The transflective layer 130 may be disposed in the pixel region PXL between the second insulating layer 20 and the first electrode 140. The transflective layer 130 may be formed of a silicon-based material with a higher refractive index than the first electrode 140. For example, the transflective layer 130 may be formed of a material including at least one of silicon carbide (SiC), a-Si, and p-Si.

The transflective layer 130 may be formed to a thickness of 50 Å to 200 Å. In a case when the thickness of the transflective layer 130 is less than 50 Å, the reflective efficiency of the transflective layer 130 may be lowered. In a case when the thickness of the transflective layer 130 is greater than 200 Å, the transflective layer 130 may appear reddish and may thus deteriorate the color.

A rear structure including the transflective layer 130 may be employed to improve the front transmissivity of the OLED display device 1. In a comparative example, an OLED display device generally has a low front transmissivity even though front transmissivity is one of the most important factors for determining the optical efficiency of an OLED display device.

To improve the efficiency of emission of light, a resonance effect may be used. To produce a resonance effect, two reflective mirrors may be provided with space therebetween, and light is repeatedly reflected between the two reflective mirrors, thereby causing constructive interference and destructive interference. This configuration is further described below with reference to the drawings.

Light amplified by such constructive interference may be instantaneously emitted to the outside from between the two reflective mirrors. That is, if the OLED display device 1 is formed to have a resonance structure capable of realizing a resonance effect, light generated in the OLED display device 1 may be collected at the front of the OLED display device 1, and as a result, the amount of light emitted within a set range of angles with respect to the front of the OLED display device 1 may increase. Accordingly, the optical efficiency of the OLED display device 1 may be improved.

A reflective mirror and a transflective mirror form a resonance structure in the OLED display device 1. The transmissivity/reflectivity of the reflective mirror and the transflective mirror affect how the reflective mirror and the transflective mirror reflect light. However, since light generated in the OLED display device 1 is repeatedly reflected by the reflective mirror, the reflective mirror and the transflective mirror may be formed with a material having low light absorptivity to improve the optical efficiency of the OLED display device 1. The reflective mirror may be formed of a metal material with excellent reflectivity and low light absorptivity, such as Al, and will be described later in detail together with a second electrode 180.

A material with low light absorptivity may be used to form the transflective mirror, i.e., the transflective layer 130. In an OLED display device according to a comparative example, Ag may be used to form the transflective layer 130. However, the Ag of the transflective layer 130 may agglomerate and may thus be eluted into the organic light-emitting layer 170 due to its inherent properties, thereby causing dark spots. To prevent the elution of the Ag of the transflective layer 130 into the organic light-emitting layer 170, ITO, which is used to form the first electrode 140, is formed thickly in the related-art OLED display device.

However, in the OLED display device 1 according to an exemplary embodiment of the present invention, the transflective layer 130 may be formed of at least one silicon-based material such as SiC, a-Si, and/or p-Si, rather than Ag, thereby addressing the problems associated with the use of Ag, such as dark spot defects, and forming a thin first electrode 140.

The first electrode 140 may be formed to a thickness of 50 Å to 100 Å. In a case when the thickness of the first electrode 140 is less than 50 Å, the contact resistance between the first electrode 140 and the organic light-emitting layer 170 may increase, and the transflective layer 130 may not be properly protected against plasma damage from a subsequent process. In a case when the thickness of the first electrode 140 is greater than 100 Å, the first electrode 140 may be thick.

Since the transflective layer 130 and the second insulating layer 20 are formed of the same silicon-based material, and the transflective layer 130 and the second insulating layer 20 may be formed in a single chamber by changing the atmospheric content, bonding stress between the transflective layer 130 and the second insulating layer 20 may be minimized. Also, the bonding stress between the transflective layer 130, which is formed of a silicon-based material, and the first electrode 140, which is formed of a transparent conductive oxide, may be minimized.

The transflective layer 130 may be formed of a silicon-based material with a higher refractive index than the first electrode 140, and may thus improve light reflection efficiency. As a result, resonance efficiency may be improved.

More specifically, in a case when the first electrode 140 is formed of ITO, which has a refractive index of 1.8 to 2.0, and the transflective layer 130 is formed of a-Si, which has a refractive index of 4.25 to 4.3, the refractive indexes of the first electrode 140 and the transflective layer 130 may have a difference of about 2.3. Alternatively, in a different case when the transflective layer 130 is formed of polycrystalline silicon or SiC, which each have a refractive index of 2.6 to 2.7, the refractive indexes of the first electrode 140 and the transflective layer 130 may have a difference of about 0.6 to 0.9. Accordingly, the transflective layer 130 may be formed to have a difference of 0.5 or greater in refractive index with the first electrode 140.

At the interface between two surfaces with a large difference in refractive index, a considerable amount of light may be totally reflected, thereby improving the resonance efficiency of the OLED display device 1. As a result, the probability of the constructive interference of light generated in the organic light-emitting layer 170 may be improved. Accordingly, the light generated in the organic light-emitting layer 170 may be collected at the front of to the pixel region PXL, and the amount of light emitted within a predetermined range of angles with respect to the front of the pixel region PXL may increase. Therefore, the optical efficiency of the OLED display device 1 may be improved.

A third insulating layer 30 may be disposed on the second insulating layer 20 where the transflective layer 130 and the first electrode 140 are formed. The third insulating layer 30 may include an inorganic material such as an oxide or a nitride, or an organic material. For example, the third insulating layer 30 may be formed as an inorganic insulating layer including $SiO_2$, $SiN_x$, $SiON$, $Al_2O_3$, $TiO_2$, $Ta_2O_5$, $HfO_2$, $ZrO_2$, BST, and/or PZT, or may be formed as an organic insulating layer including a general universal polymer such as poly(methyl methacrylate) (PMMA) or polystyrene (PS), a polymer derivative having a phenol group, an acryl-based polymer, an imide-based polymer, an aryl ether-based polymer, an amide-based polymer, a fluoro-based polymer, a p-xylene-based polymer, a vinyl alcohol-based polymer, and a blend thereof. The third insulating layer 30 may be formed as a complex stack of the inorganic insulating layer and the organic insulating layer. The third insulating layer 30 may be formed by, for example, spin coating.

The third insulating layer 30 may include a first opening H1, which is disposed in the pixel region PXL, and third openings H3, which are disposed in the transistor region TR. The third insulating layer 30 may also include a second opening H2, which is disposed in the boundary area between the pixel region PXL and the transistor region TR.

A fourth opening H4 may be formed by partially opening a fourth insulating layer 40, and may be disposed inside the first opening H1 to expose part of the first electrode 140, and the organic light-emitting layer 170 may be disposed on the exposed part of the first electrode 140 to connect the first electrode 140 and the organic light-emitting layer 170.

The third openings H3 may be formed to correspond to the source region 210S and the drain region 210D, respectively, of the active layer 210. A source electrode 250S and a drain electrode 250D, which are connected to the source region 210S and the drain region 210D, respectively, may be disposed in the third openings H3, respectively. The source electrode 250S and the drain electrode 250D may be formed by patterning a metal layer, and may be formed to have a single- or multilayer structure. For example, the source electrode 250S and the drain electrode 250D may be formed as single- or multi-layers including at least one of Al, Pt, Pd, Ag, Mg, Au, Ni, Nd, Ir, Cr, Li, Ca, Mo, Ti, W, and Cu.

The second opening H2 may be formed by partially opening the third insulating layer to expose part of the first electrode 140. The second opening H2 may connect the exposed part of the first electrode 140 and the drain electrode 250D together. In the exemplary embodiment of FIG. 1, the drain electrode 250D may be connected to the first electrode 140, but the invention is not limited thereto. For example, the first electrode 140 may be connected to the source electrode 250S.

The OLED display device 1 is illustrated in FIG. 1 as including a driving thin-film transistor (TFT) having one of the source electrode 250S and the drain electrode 250D thereof directly connected to the first electrode 140, but the invention is not limited thereto. For example, the OLED display device 1 may include a TFT other than a driving TFT, such as a switching TFT.

The fourth insulating layer 40 may be disposed on the third insulating layer 30 in an area where the source electrode 250S and the drain electrode 250D are formed. The fourth opening H4 may be formed in the pixel region PXL of the fourth insulating layer 40 to expose part of the first electrode 140.

The organic light-emitting layer 170 may be disposed on part of the first electrode 140 exposed through the fourth opening H4, and the second electrode 180 may be disposed on the organic light-emitting layer 170. The organic light-emitting layer 170 may include, for example, a hole injection layer (HIL), a hole transport layer (HTL), an emissive layer (EML), an electron transport layer (ETL), and an electron injection layer (EIL).

In the OLED display device 1, the first electrode 140 may be an anode electrode, and the second electrode 180 may be a cathode electrode. Alternatively, the first electrode 140 may be a cathode electrode, and the second electrode 180 may be an anode electrode.

The organic light-emitting layer 170 may include a low molecular organic material or a high molecular organic material. For example, the organic light-emitting layer 170 may include a stack including the HTL, the HIL, the ETL, the EIL, and may also include a stack of various other layers, if necessary.

A first charge-transmitting region 175 may be disposed between the first electrode 140 and the organic light-emitting layer 170, and a second charge-transmitting region 179 may be disposed between the organic light-emitting layer 170 and the second electrode 180. One of the first charge-transmitting region 175 and the second charge-transmitting region 179 may transmit holes, and the other charge-transmitting region may transmit electrons. For example, the first charge-transmitting region 175, which is near the first electrode 140 that is an anode electrode, may be a hole-transmitting region, and the second charge-transmitting region 179, which is near the second electrode 180 that is a cathode electrode, may be an electron-transmitting region.

The first charge-transmitting region 175 may be disposed on the first electrode 140. The first charge-transmitting region 175 may have a single-layer structure including a single material, a single-layer structure including a plurality of different materials, or a multilayer structure including a plurality of different materials. The first charge-transmitting region 175 may also include a buffer layer and a first charge-blocking layer (not shown). In the exemplary embodiment of FIG. 1, the first charge-transmitting region 175 may include a first charge injection layer 171 and a first charge transport layer 172, but the invention is not limited thereto. For example, one of the first charge injection layer 171 and the first charge transport layer 172 may be optional, or the first charge injection layer 171 and the first charge transport layer 172 may be incorporated into a single layer.

The first charge injection layer 171 may be disposed on the first electrode 140, and may improve the efficiency of the injection of holes from the first electrode 140 into the organic light-emitting layer 170. More specifically, the first charge injection layer 171 may lower an energy barrier and may thus allow holes to be effectively injected into the organic light-emitting layer 170.

The first charge injection layer 171 may include copper phthalocyanine (CuPc), N'-Di(naphthalene-1-yl)-N,N'-diphenylbenzidine (NPB), tris-8-hydroxyquinoline aluminum ($Alq_3$), 4,4',4''-tris(N-3-methylphenyl-N-phenylamino)triphenylamine(m-MTDATA), 4,4',4''-tris(diphenylamino)triphenylamine (TDATA), 4,4',4''-tris[2-naphthyl(phenyl)-amino]triphenyl-amine (2-TNATA), polyaniline/dodecylbenzenesulfonic acid (PANI/DBSA), poly(3,4-ethylene dioxythiophene)/polystyrene sulfonate (PEDOT/PSS), polyaniline/camphorsulfonic acid (PANI/CSA), and/or polyaniline/polystyrene sulfonate (PANI/PSS).

The first charge transport layer 172 may be disposed on the first charge injection layer 171, and may transmit the holes injected into the first charge injection layer 171 to the organic light-emitting layer 170. The hole transport efficiency of the first charge transport layer 172 may be optimized when the highest occupied molecular energy (HOMO) of the first charge transport layer 172 is substantially lower than the work function of the material of the first electrode 140 and is substantially higher than the HOMO of the organic light-emitting layer 170.

For example, the first charge transport layer 172 may include 4,4'-bis[N-(1-napthyl)-N-phenyl-amino]biphenyl (NPD), N,N'-diphenyl-N,N'-bis[3-methylphenyl]-1,1'-biphenyl-4,4'-diamine) (TPD), 2,2',7,7'-tetrakis-(N,N-diphenylamino)-9,9'-spirobifluoren (s-TAD), 4,4',4''-tris(N-3-methylphenyl-N-phenylamino)triphenylamine(m-MTDATA), poly-(3,4)-ethylenedihydroxy thiophene (PEDOT), or polyaniline (PANI), but the invention is not limited thereto. For example, the first charge transport layer 172 may include an organic material such a poly-phenylenevinylene (PPV)-based or polyfluorene-based polymer organic material.

The first charge-transmitting region 175 may also include a charge-generating material to improve conductivity. The charge-generating material may be uniformly or non-uniformly scattered in the first charge-transmitting region 175. For example, the charge-generating material may be a p-dopant. The p-dopant may be one of a quinone derivative, a metal oxide and a compound containing a cyano group, but the invention is not limited thereto. Non-limiting examples of the p-dopant include a quinone derivative such as tetracyanoquinodimethane (TCNQ) or 2,3,5,6-tetrafluoro-tetracyanoquinodimethane (F4-TCNQ) and a metal oxide such as tungsten oxide and molybdenum oxide.

As already mentioned above, the first charge-transmitting region 175 may also include at least one of a buffer layer and a first charge-blocking layer (not shown). The buffer layer may compensate for a resonance distance of light emitted from the organic light-emitting layer 170 depending on the wavelength of the light, and may thus improve the efficiency of the emission of the light. The buffer layer may include the same material(s) as the first charge-transmitting region 175. The first charge-blocking layer may prevent the injection of charges from the second charge-transmitting region 179 to the first charge-transmitting region 175.

The organic light-emitting layer 170 may be disposed in the first charge-transmitting region 175. Organic light-emitting layer 170 may be formed of a material that is typical for use in a light-emitting layer. For example, the organic light-emitting layer 170 may be formed of a material that emits red light, green light and blue light. The organic light-emitting layer 170 may include a fluorescent material or a phosphorescent material.

In an exemplary embodiment, the organic light-emitting layer 170 may include a host and a dopant.

For example, $Alq_3$, 4,4'-N,N'-dicarbazole-biphenyl (CBP), poly(N-vinylcarbazole) (PVK), 9,10-Bis(2-naphthalenyl)anthracene (ADN), 4,4',4''-tris(N-carbazolyl)triphenylamine (TCTA), 1,3,5-tris(N-phenylbenzimiazole-2-yl)benzene (TPBi), 2-(t-butyl)-9,10-bis(20-naphthyl)anthracene (TBADN), distyrylarylene (DSA), 4,4'-Bis(9-carbazolyl)-2,2'-dimethyl-biphenyl (CDBP), or 2-methyl-9,10-bis(naphthalen-2-yl)anthracene (MADN) may be used as the host.

For example, a fluorescent dopant or a phosphorescent dopant may be used as the dopant. The type of the dopant may be varied depending on the color of light to be emitted by the organic light-emitting layer 170.

For example, a fluorescent material containing 2-biphenyl-4-yl-5-(4-t-butylphenyl)-1,3,4-oxadiazole:tris(dibenzoylmethane)mono(1,10-phenanthroline)europium(lll) (PBD:$Eu(DBM)_3(Phen)$) or perylene (P) may be selected as a red dopant. Alternatively, a phosphorescent material containing a metal complex, such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr) or octaethylporphyrin platinum (PtOEP)), or an organometallic complex may be selected as the red dopant.

For example, a fluorescent material containing $Alq_3$ may be selected as a green dopant. Alternatively, a phosphorescent material such as fac-tris(2-phenylpyridine)iridium (Ir$(ppy)_3$), bis(2-phenylpyridine)(acetylacetonate)iridium(III) (Ir$(ppy)_2$(acac)), or 2-phenyl-4-methyl-pyridine iridium (Ir$(mpyp)_3$) may be selected as the green dopant.

For example, a fluorescent material containing one selected from the group including spiro-4,'-bis(2,2'-diphenylvinyl)1,1'-biphenyl(spiro-DPVBi), spiro-sixphenyl (spiro-6P), distyrylbenzene (DSB), distyrylarylene (DSA), a polyfluorene (PFO)-based polymer and a poly p-phenylene vinylene (PPV)-based polymer may be selected as a blue dopant. Alternatively, a phosphorescent material such as bis[2-(4,6-difluorophenyl)pyridinato-N,C2']iridium picolinate ($F_2$Irpic), bis[2-(4,6-difluorophenyl)pyridinato-N,C2'] iridium 2,2,6,6-tetramethylheptane-3,5-dione (($F_2$ppy)$_2$Ir (tmd)), or tris[1-(4,6-difluorophenyl)pyrazolate-N,C2'] iridium (Ir(dfppz)$_3$) may be selected as the blue dopant.

The second charge-transmitting region 179 may be disposed on the organic light-emitting layer 170. The second charge-transmitting region 179 may have a single-layer structure including a single material, a single-layer structure including a plurality of different materials, or a multilayer structure including a plurality of different materials. The second charge-transmitting region 179 may also include a first charge-blocking layer. In the exemplary embodiment of FIG. 1, the second charge-transmitting region 179 may include a second charge transport layer 176 and a second charge injection layer 177, but the invention is not limited thereto. That is, one of the second charge transport layer 176 and the second charge injection layer 177 may be optional and may thus not be provided, or the second charge transport layer 176 and the second charge injection layer 177 may be incorporated into a single layer.

The second charge transport layer 176 may be disposed on the organic light-emitting layer 170, and may transmit the holes injected into the second charge injection layer 177 to the organic light-emitting layer 170.

For example, the second charge transport layer 176 may include Alq$_3$, TPBi, 2,9-dimethyl-4,7-diphenyl-1,10-phenanthroline (BCP), 4,7-diphenyl-1,10-phenanthroline (Bphen), 3-(Biphenyl-4-yl)-5-(4-tert-butylphenyl)-4-phenyl-4H-1,2,4-triazole (TAZ), 4-(naphthalen-1-yl)-3,5-diphenyl-4H-1,2,4-triazole), tBu-PBD(2-(4-biphenylyl)-5-(4-tert-butyl-phenyl)-1,3,4-oxadiazole (NTAZ), bis(2-methyl-8-quinolinolato-N1,O8)-(1,1'-Biphenyl-4-olato)aluminum (BAlq), bis(10-hydroxybenzo[h]quinolinato)beryllium (Bebq$_2$), ADN and/or a blend thereof, but the invention is not limited thereto.

The second charge injection layer 177 may be disposed on the second charge transport layer 176, and may improve the efficiency of the injection of electrons from the second electrode 180 into the organic light-emitting layer 170.

The second charge injection layer 177 may be formed of a lanthanide metal such as LiF, LiQ, Li$_2$O, BaO, NaCl, CsF, or Yb or a halide metal such as RbCl, RbI, but the invention is not limited thereto. For example, the second charge injection layer 177 may be formed of a mixture of the lanthanide metal or the halide metal and an insulating organometallic salt. The organometallic salt may be a material with an energy band gap of about 4 eV or higher. For example, the organometallic salt may include metal acetate, metal benzoate, metal acetoacetate, metal acetylacetonate, and/or metal stearate.

The second charge-transmitting region 179 may also include the second charge-blocking layer. The second charge-blocking layer may include at least one of BCP and Bphen, but the invention is not limited thereto.

The second electrode 180 may be disposed on the second charge-transmitting region 179. The second electrode 180 may be a front electrode or a common electrode. The second electrode 180 may include a conductive material with a lower work function relative to the first electrode 140.

Light may be emitted from the organic light-emitting layer 170 toward the substrate 5 or toward the opposite side of the substrate 5. If the second electrode 180 is a common electrode, the level of current applied to each pixel may be varied by a voltage drop in the second electrode 180. As the size of the OLED display device 1 increases, the amount of the voltage drop also increases, and thus, second electrode 180 may have low resistance. To improve the optical efficiency of the OLED display device 1, the resonance efficiency of the OLED display device 1 may be increased.

Accordingly, the second electrode 180 may be formed of a low-resistance metal material with reflective properties so as to reduce the resistance of the second electrode 180 and to allow the second electrode 180 to serve as a reflective electrode. For example, the second electrode 180 may be formed of a low-resistance material such as, Ag, Al, Mg, Li, Ca, Pt, lead (Pd), Au, Ni, Nd, Ir, Cr, LiF/Ca, LiF/Al, and a mixture thereof. By forming the second electrode 180 as a reflective electrode, light emitted from the organic light-emitting layer 170 may be directed toward the substrate 5.

The transflective layer 130 and the second electrode 180 may serve as a transflective mirror and a reflective mirror, respectively, and may allow light emitted from the organic light-emitting layer 170 to resonate therebetween. Accordingly, the optical efficiency of the OLED display device 1 may be improved.

The first electrode 140 may be thinly formed by forming the transflective layer 130 of at least one of a-Si, p-Si and SiC, instead of Ag. Accordingly, a thin-shaped OLED display device 1 may be provided.

Figure 2:
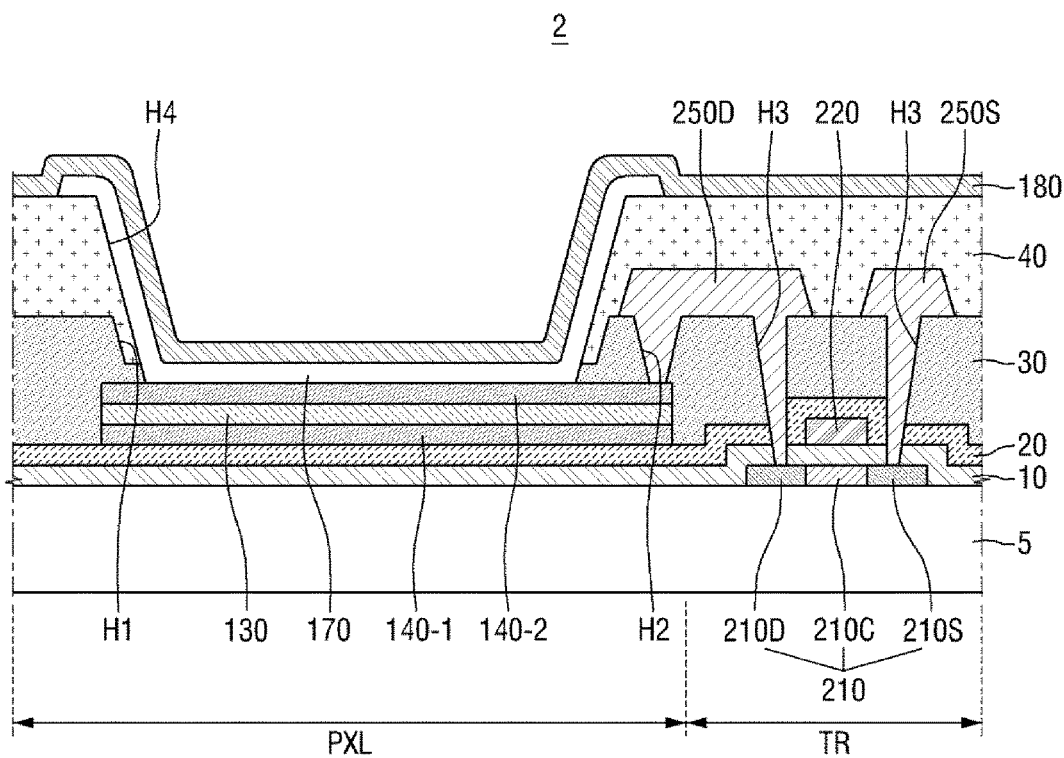
FIG. 2 is a cross-sectional view of an OLED display device according to another exemplary embodiment.

FIG. 2 is a cross-sectional view of an OLED display device according to another exemplary embodiment of the invention. An OLED display device 2 of FIG. 2 is similar to the OLED display device 1 of FIG. 1, and thus will hereinafter be described, focusing mainly on differences with differences with the OLED display device 1.

Referring to FIG. 2, an active layer 210 may be formed in a transistor region TR of a substrate 5, and a first insulating layer 10 may be disposed on the active layer 210. A gate electrode 220 may be disposed on the first insulating layer 10. A second insulating layer 20 may be formed on the first insulating layer 10 where the gate electrode 220 is formed, and a first transparent electrode 140-1, a transflective layer 130, and a second transparent electrode 140-2 may be disposed on the second insulating layer 20. The second transparent electrode 140-2 may be similar to the first electrode 140 of FIG. 1.

The first transparent electrode 140-1 and the second transparent electrode 140-2 may be formed of the same material(s) as the first electrode 140 of FIG. 1. The transflective layer 130 may be disposed between the first transparent electrode 140-1 and the second transparent electrode 140-2, and a relatively large difference in refractive index may be generated at the interface between the transflective layer 130 and the second transparent electrode 140-2. Due to the difference in refractive index between the transflective layer 130 and the second transparent electrode 140-2, the reflective efficiency of the transflective layer 130 may be improved, and as a result, resonance efficiency may increase. Accordingly, the optical efficiency of the OLED display device 2 may be improved.

The bonding stress between the second insulating layer 20 and the first transparent electrode 140-1 and the bonding stress between the first transparent electrode 140-1 and the transflective layer 130, which may be formed of a silicon-based material, may be reduced. The bonding stress between the transflective layer 130, which is formed of a silicon-based material, and the second transparent layer 140-2 may also be reduced. Accordingly, bonding stability may be improved.

A third insulating layer 30 may be formed on the second insulating layer 20 where the first transparent electrode 140-1, the second transparent electrode 140-2 and the transflective layer 130 are formed, and a plurality of openings, i.e., a first opening H1, a second opening H2 and third openings H3, may be formed on the third insulating layer 30 as in the exemplary embodiment of FIG. 1. As a result, a source electrode 250S and a drain electrode 250D may be electrically connected to the second transparent electrode 140-2, which serves as the first electrode 140 of FIG. 1.

A fourth insulating layer 40 may be disposed on the third insulating layer 30 where the source electrode 250S and the drain electrode 250D are formed, and a fourth opening H4, which exposes part of the second transparent electrode 140-2 therethrough, may be formed on the fourth insulating layer 40. An organic light-emitting layer 170 and a second electrode 180 may be disposed on the second transparent electrode 140-2.

In the exemplary embodiment of FIG. 2, the first transparent electrode 140-1 and the second transparent electrode 140-2, which be adhesive, may be provided, and the transflective layer 130 may be disposed between the first transparent electrode 140-1 and the second transparent electrode 140-2. Accordingly, bonding stability may be secured. Also, since a relatively large difference in refractive index is generated between the transflective layer 130 and the second transparent electrode 140-2, the reflective efficiency of the transflective layer 130 may be improved. As a result, optical efficiency (or resonance efficiency) may be improved, the occurrence of dark spot defects may be reduced, a thin-shaped OLED display device 2 may be realized, and the optical efficiency of the OLED display device 2 may be improved.

Figure 3:
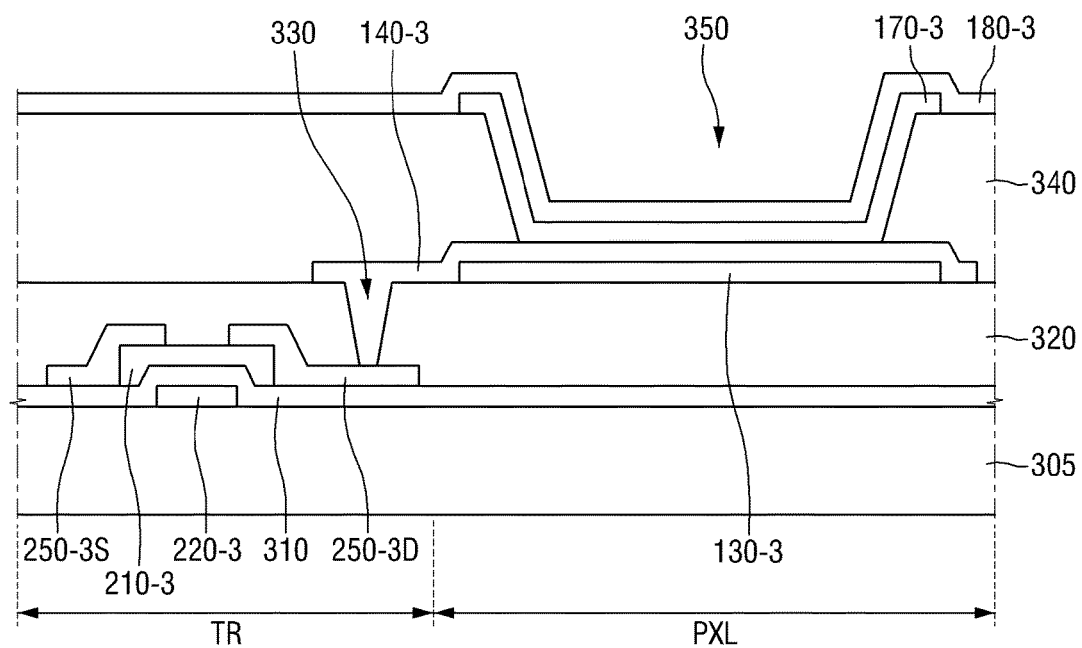
FIG. 3 is a cross-sectional view of an OLED display device according to another exemplary embodiment.

FIG. 3 is a cross-sectional view of an OLED display device according to another exemplary embodiment of the invention. An OLED display device 3 of FIG. 3 is similar to the OLED display device 1 of FIG. 1, and thus will hereinafter be described, focusing mainly on differences with differences with the OLED display device 1.

Referring to FIG. 3, a transistor device may be disposed in a transistor region TR of a substrate 305.

The transistor device may include a gate electrode 220-3, which is formed on the substrate 305. A gate insulating layer 310, which may insulate the gate electrode 220-3, may be disposed on an entire surface of the substrate 305 where the gate electrode 220-3 is formed.

An active layer 210-3 may be disposed on the gate insulating layer 310. The active layer 210-3 may be disposed to at least partially overlap the gate electrode 220-3.

A source electrode 250-3S and a drain electrode 250-3D may be disposed on the substrate 305 where the active layer 210-3 is formed. The source electrode 250-3S and the drain electrode 250-3D may be disposed to at least partially the active layer 210-3. Alternatively, the source electrode 250-3S and the drain electrode 250-3D may be disposed such that the entire bottom surfaces of the source electrode 250-3S and the drain electrode 250-3D overlap the active layer 210-3.

By forming the source electrode 250-3S and the drain electrode 250-3D on the gate electrode 220-3, a transistor device may be formed. A passivation layer 320 may be disposed to protect the transistor device. A transflective layer 130-3 and a first electrode 140-3 may be disposed on the passivation layer 320.

The first electrode 170-3 may be connected to the drain electrode 250-3D of the transistor device through a contact hole 330, which is formed through the passivation layer 320.

The first electrode 140-3 may be disposed on the transflective layer 130-3 to cover the transflective layer 130-3. The transflective layer 130-3 may be formed of a material with a relatively higher refractive index than the first electrode 140-3. The transflective layer 130-3 may be formed of at least one of a-Si, p-Si, and SiC. The transflective layer 130-3 may be formed of a material with a refractive index of 2.5 or higher.

The first electrode 140-3 may be formed of at least one of ITO, SnO, IZO, ZnO, $In_2O_3$, IGO, AZO, and GZO.

The refractive indexes of the first electrode 140-3 and the transflective layer 130-3 may have a difference of 0.5 or greater.

The transflective layer 130-3 may be formed to a thickness of 50 Å to 200 Å, and the first electrode 140-3 may be formed to a thickness of 50 Å to 100 Å. By reducing the thicknesses of the transflective layer 130-3 and the first electrode 140-3, a thin-shaped OLED display device 3 may be realized.

A pixel-defining layer (PDL) 340 may be disposed on the substrate 305 where the first electrode 140-3 is formed. An opening 350, which exposes part of the first electrode 140-3 therethrough, may be disposed on the PDL 340.

An organic light-emitting layer 170-3 may be disposed on part of the first electrode 140-3 exposed through the opening 350. A second electrode 180-3 may be disposed on the organic light-emitting layer 170-3.

In the exemplary embodiment of FIG. 3, a silicon-based material with a high refractive index, instead of Ag, may be used in the transflective layer 130-3. As a result, optical efficiency (or resonance efficiency) may be improved, the occurrence of dark spot defects may be reduced, and a thin-shaped OLED display device 3 may be realized.

FIGS. 4 to 13 are cross-sectional views illustrating a method of manufacturing an OLED display device, according to an exemplary embodiment of the invention.

The method of manufacturing an OLED display device, according to an exemplary embodiment of the invention, will hereinafter be described with reference to FIG. 4 to 13 and with further reference to FIG. 1.

Figure 4:
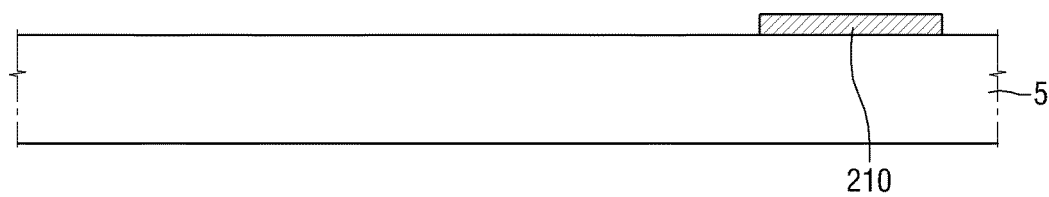
FIGS. 4, 5, 6, 7, 8, 9, 10, 11, 12, and 13 are cross-sectional views illustrating a method of manufacturing an OLED display device according to an exemplary embodiment.

Referring to FIG. 4, a semiconductor layer (not illustrated) may be formed on a substrate 5, and an active layer 210 of a transistor device may be formed by patterning the semiconductor layer.

More specifically, the semiconductor layer may be patterned by depositing the semiconductor layer on the substrate 5, applying photoresist (not illustrated) onto the semiconductor layer, and performing a photolithography operation with the use of a photomask (not illustrated). As a result of the patterning of the semiconductor layer, the active layer 210 may be formed. The photolithography operation with the use of the photomask may include exposing the photomask to light with the use of an exposure device (not illustrated) and performing a series of operations such as developing, etching, and stripping/ashing.

The semiconductor layer may be formed of a-Si or p-Si. In a case where the semiconductor layer is formed of p-Si, p-Si may be obtained by crystallizing a-Si. The crystallization of a-Si may be performed by using various methods such as rapid thermal annealing (RTA), solid phase crystallization (SPC), excimer laser annealing (ELA), metal induced crystallization (MIC), metal induced lateral crystallization (MILC), or sequential lateral solidification (SLS).

Figure 5:
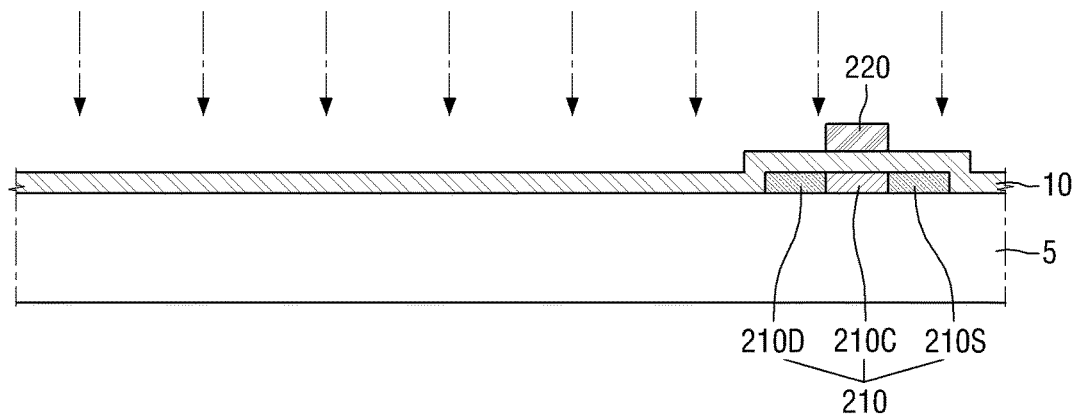

Referring to FIG. 5, a first insulating layer 10 may be formed on the substrate 5 in an area where the active layer 210 is formed. The first insulating layer 10 may insulate the active layer 210. The first insulating layer may be formed by depositing an organic material or an inorganic material such as SiNx, SiO$_2$, SiON, Al$_2$O$_3$, TiO$_2$, Ta$_2$O$_5$, HfO$_2$, ZrO$_2$, BST, and PZT with the use of various deposition methods, such as PECVD, APCVD, or LPCVD.

A first conductive material layer (not illustrated) may be formed on the first insulating layer 10. The first conductive material layer may be formed of formed as a single- or multi-layer including at least one metal such as Al, Pt, Pd, Ag, Mg, Au, Ni, Nd, Ir, Cr, Li, Ca, Mo, Ti, W, and Cu.

A gate electrode 220 may be formed in a transistor region TR of the first insulating layer 10 by patterning the first conductive material layer.

After the formation of the gate electrode 220, the active layer 210 may be doped with ion impurities. By using the gate electrode 220 as a self-aligned mask, the active layer 210 may be doped with ion impurities, thereby forming a source region 210S and a drain region 210D, which are doped with ion impurities, and forming a channel region 210C between the source region 210S and the drain region 210D.

Even though not specifically illustrated in FIG. 5, a wire such as a scan line, which is connected to the gate electrode 220, may also be formed, during the formation of the gate electrode 220, by patterning the first conductive material layer.

Figure 6:
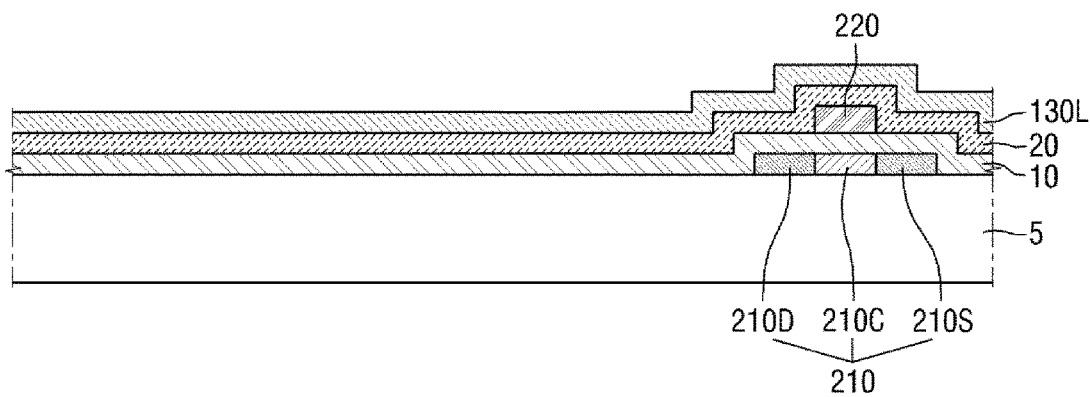

Referring to FIG. 6, a second insulating layer 20 and a transflective material layer 130L may be formed on the first insulating layer 10 where the gate electrode 220 is formed.

The second insulating layer 20 may be formed as a transparent insulating layer including a silicon-based material. For example, the second insulating layer 20 may be formed as a silicon-based insulating layer including SiNx, SiO$_2$, or a combination thereof.

The transflective material layer 130L may be formed on the second insulating layer 20, consecutively following the formation of the second insulating layer 20. The transflective material layer 130L may be formed of a silicon-based material including at least one of SiC, a-Si, and p-Si.

For example, the second insulating layer 20 may be formed in a single chamber under a nitrogen or oxygen atmosphere, and an a-Si layer for forming the transflective material layer 130L may be formed in the chamber by changing the atmosphere inside the chamber into a hydrogen atmosphere.

The transflective material layer 130L may be formed on the second insulating layer 20 to have a thickness of 50 Å to 200 Å. For example, the transflective material layer 130L may be formed of a-Si to have a thickness of 50 Å to 200 Å, thereby addressing the problem of a thick a-Si layer appearing reddish in comparative examples.

The second insulating layer 20 and the transflective material layer 130L may be consecutively formed in a single chamber. Accordingly, the formation of a transflective layer 130 may be simplified, and productivity may be improved. Also, since the transflective material layer 130L is formed of the same silicon-based material as the second insulating layer 20, the bonding stress between the second insulating layer 20 and the transflective layer 130L may be alleviated. The transflective material layer 130L may be formed of a material with a large difference in refractive index with a transparent material layer 140L, which is to be formed on the transflective material layer 130L.

More specifically, in a comparative method of manufacturing an OLED display device, a first transparent layer is formed of ITO, in consideration of the bonding stress with a second insulating layer 20, to form an Ag transflective layer 130 and for this, a process of depositing ITO is performed. Thereafter, the Ag transflective layer 130 is formed on the first transparent layer, and a second transparent layer, which is to a pixel electrode, is formed on the Ag transflective layer 130. However, the formation of the Ag transflective layer 130 may require changing from one chamber to another chamber or from one atmosphere to another atmosphere, and thus increases the manpower and the tact time. Also, since Ag is highly likely to agglomerate and to be eluted, the Ag transflective layer 130 may cause dark spot defects, which result in the deterioration of the quality of display. To address this problem, in other comparative embodiments, transparent electrodes may be thick, with the Ag transflective layer 130 interposed therebetween. However, due to the thick transparent electrodes, there is a clear limit in forming an OLED display device into a thin shape.

However, in the exemplary embodiment of FIGS. 4 to 13, the transflective layer 130 is formed of the same material(s) as the second insulating layer 20, thereby addressing the problems in the comparative embodiments associated with bonding stress. Also, since the transflective material layer 130L and the second insulating layer 20 are consecutively formed in the same chamber by changing the gas atmosphere in the corresponding chamber, the formation of the transflective layer 130 may be facilitated, and productivity may be improved over the comparative embodiments. Also, since a silicon-based material is used, instead of Ag, to form the transflective material layer 130L, there is no need to form thick transparent electrodes in preparation for the elution of Ag. That is, it is possible to form transparent electrodes into a thin shape.

Figure 7:
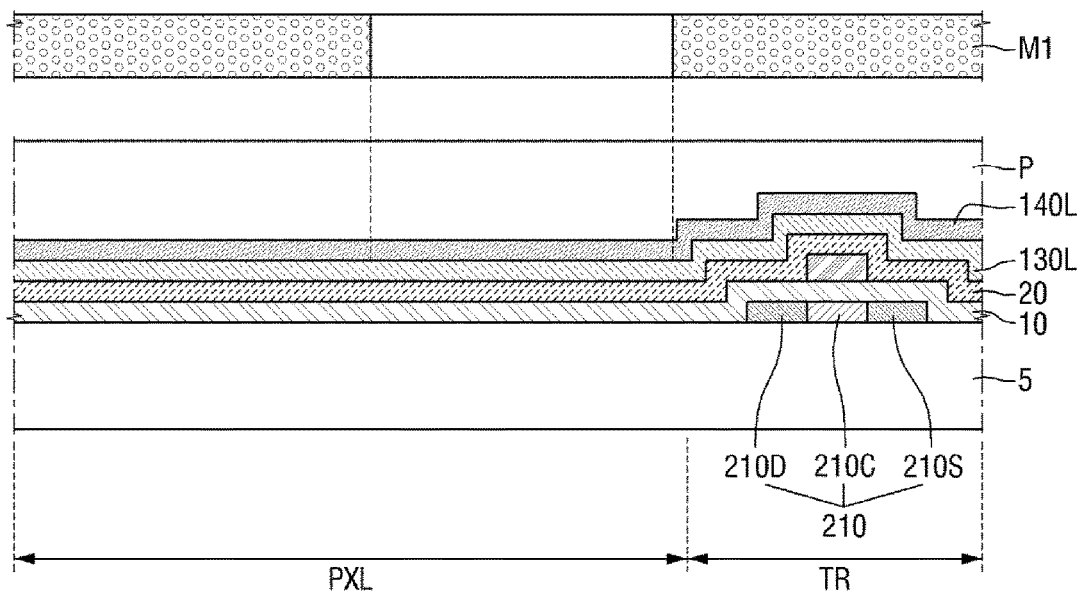

Referring to FIG. 7, the transparent material layer 140L may be formed on the transflective material layer 130. The transparent material layer 140L may be formed of at least one of ITO, SnO, IZO, ZnO, In$_2$O$_3$, IGO, AZO, and GZO.

A photoresist layer P may be formed on the transparent material layer 140L. The photoresist layer P may be exposed to light by using a first mask M1. A first electrode 140 may be formed in a pixel region PXL by subjecting the transparent material layer 140L to, for example, etching.

Figure 8:
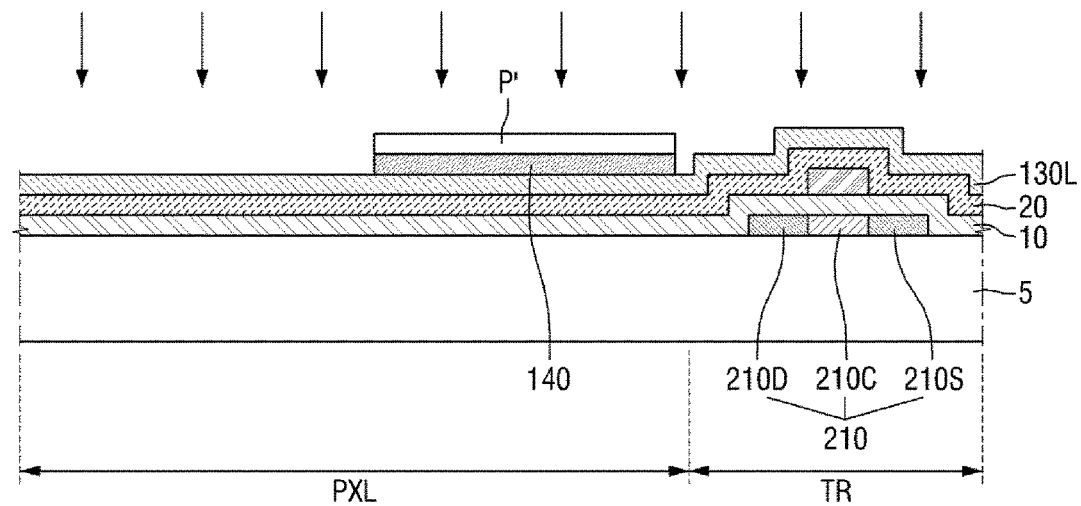

Referring to FIG. 8, the transflective material layer 130L, which is formed below the first electrode 140, may be exposed. An uncured or cured photosensitive pattern P' may remain on the first electrode 140. The transflective material layer 130 may be etched by using the photosensitive pattern P' or the first electrode 140 as a mask. The transflective material layer 130L may be etched by using a dry etching method. The photosensitive pattern P' may prevent the first electrode 140 from being damaged by plasma damage during a dry etching process for etching the transflective material layer 130L. The photosensitive pattern P' may adjust the amount of exposure to light and may thus prevent the second insulating layer 20 and the first insulting layer 10 from being damaged.

Figure 9:
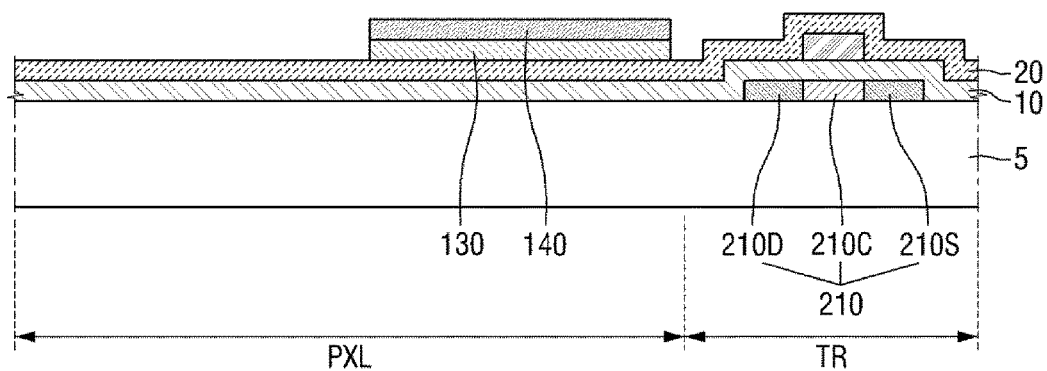

Referring to FIG. 9, the transflective layer 130 may be formed below the first electrode 140 in the pixel region PXL by etching the transflective material layer 130L. After the etching of the transflective material layer 130L, the photosensitive pattern P' may be removed from the first electrode 140.

Figure 10:
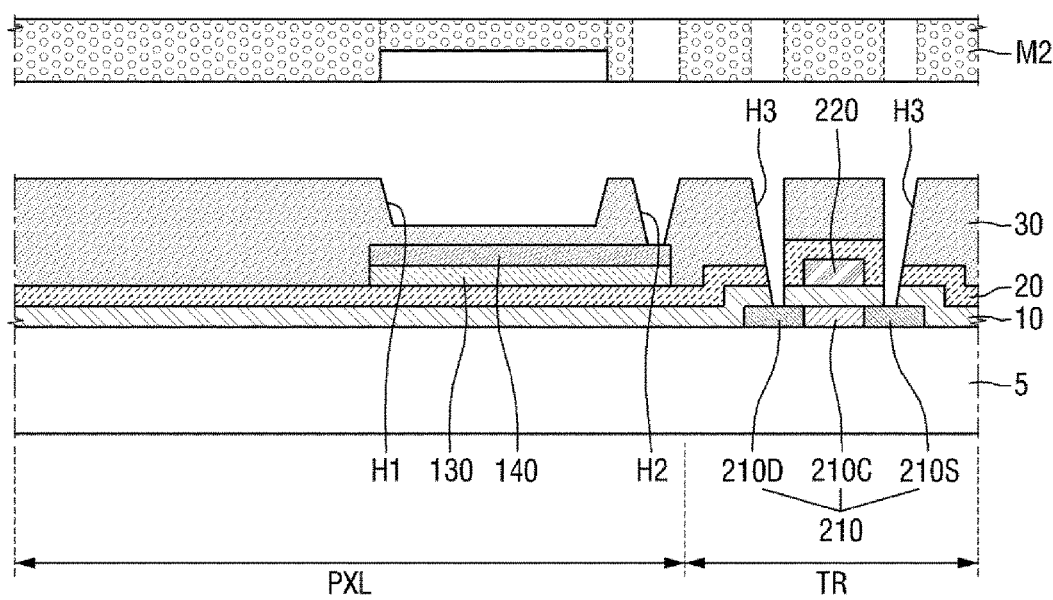

Referring to FIG. 10, a third insulating layer 30 may be formed on the second insulating layer 20 in a region where the transflective layer 130 and the first electrode 140 are formed. The third insulating layer 30 may include an inorganic material, such as an oxide or a nitride, or may include an organic material. The third insulating layer 30 may be formed as an inorganic insulating layer including $SiO_2$, SiNx, SiON, $Al_2O_3$, $TiO_2$, $Ta_2O_5$, $HfO_2$, $ZrO_2$, BST, and/or PZT, or may be formed as an organic insulating layer including a general universal polymer such as PMMA or PS, a polymer derivative having a phenol group, an acryl-based polymer, an imide-based polymer, an aryl ether-based polymer, an amide-based polymer, a fluoro-based polymer, a p-xylene-based polymer, a vinyl alcohol-based polymer, and a blend thereof. Alternatively, the third insulating layer 30 may be formed as a complex stack of the inorganic insulating layer and the organic insulating layer. The third insulating layer 30 may be formed by, for example, spin coating.

A first opening H1, reduces some of the thickness of the third insulating layer 30 on the first electrode 140, and third openings H3, which expose parts of the source region 210S and the drain region 210D of the active layer 210 in the transistor region TR therethrough. The first opening H1 may be formed by patterning the third insulating layer 30. A second opening H2, which connects one of a source electrode 250S and a drain electrode 250D to the first electrode 140, may be formed in the boundary between the pixel region PXL and the transistor region TR.

The first opening H1, the second opening H2 and the third openings H3 may be formed by using a halftone mask M2. The halftone mask M2 may include a light-transmitting portion, a semi-light-transmitting portion, and a light-blocking portion. More specifically, the second opening H2, which connects the first electrode 140 and one of the source electrode 250S and the drain electrode 250D, and the third openings H3, which expose the source region 210S and the drain region 210D of the active layer 210 therethrough, may be formed in an area corresponding to the light-transmitting portion of the halftone mask M2, and the first opening H1, which reduces some of the thickness of the third insulating layer 30 on the first electrode 140, may be formed in an area corresponding to the semi-light-transmitting portion of the halftone mask M2. Since at least some of the third insulating layer 30 may be left on the first electrode 140 without completely exposing the first electrode 140, damage to the first electrode 140 may be prevented.

Figure 11:
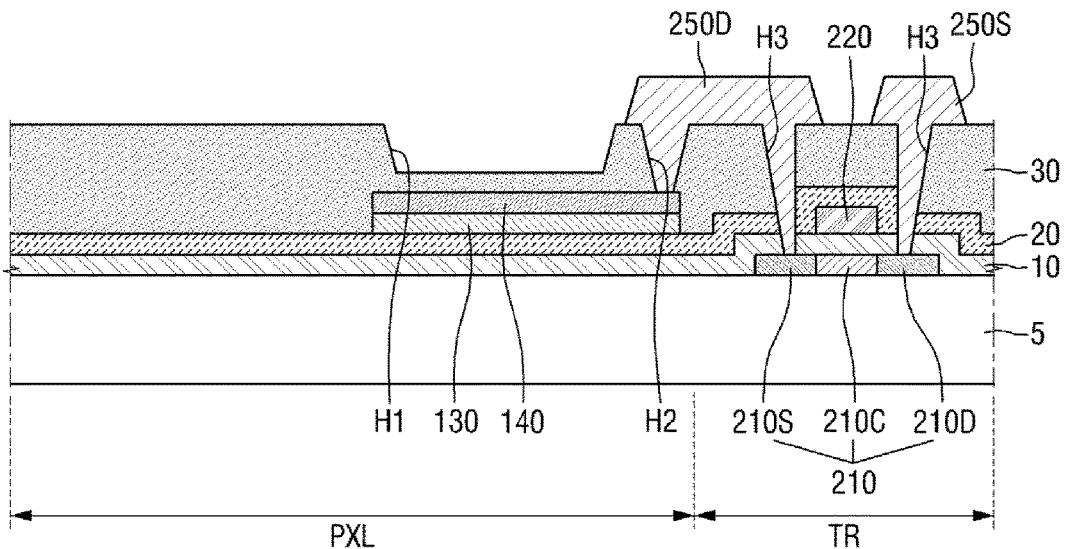

Referring to FIG. 11, a second conductive material layer (not illustrated) may be formed on the third insulating layer 30 in an area where the first opening H1, the second opening H2 and the third openings H3 are formed, and the source electrode 250S and the drain electrode 250D may be formed by performing photolithography on the second conductive material layer.

The second conductive material layer may be formed as a single- or multi-layer structure including at least one metal, such as, Al, Pt, Pd, Ag, Mg, Au, Ni, Nd, Ir, Cr, Li, Ca, Mo, Ti, W, and Cu.

One of the source electrode 250S and the drain electrode 250D may be electrically connected to the first electrode 140 through the second opening H2. For example, the source electrode 250S and the drain electrode 250D may be connected to the source region 210S and the drain region 210D, respectively, through the third openings H3.

Figure 12:
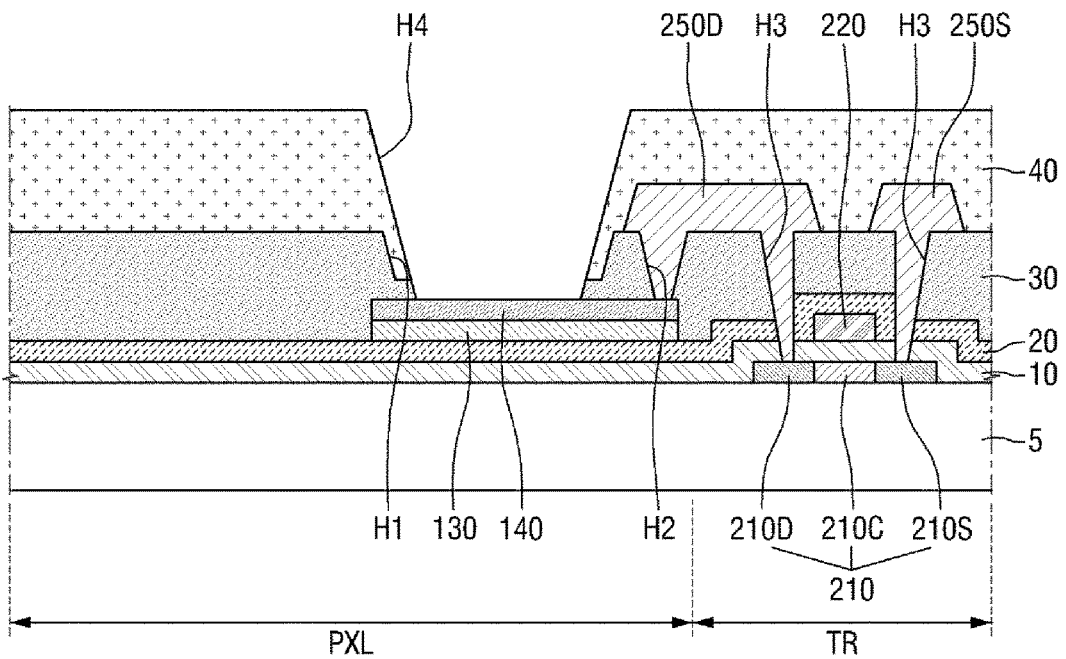

Referring to FIG. 12, a fourth insulating layer 40 may be formed on the third insulating layer 30 where the source electrode 250S and the drain electrode 250D are formed. The fourth insulating layer 40 may include an inorganic material such as an oxide or a nitride, or may include an organic material. The fourth insulating layer 40 may be formed as an inorganic insulating layer including $SiO_2$, SiNx, SiON, $Al_2O_3$, $TiO_2$, $Ta_2O_5$, $HfO_2$, $ZrO_2$, BST, or PZT, or may be formed as an organic insulating layer including a general universal polymer such as PMMA or PS, a polymer derivative having a phenol group, an acryl-based polymer, an imide-based polymer, an aryl ether-based polymer, an amide-based polymer, a fluoro-based polymer, a p-xylene-based polymer, a vinyl alcohol-based polymer, and/or a blend thereof. Alternatively, the fourth insulating layer 40 may be formed as a complex stack of the inorganic insulating layer and the organic insulating layer. The fourth insulating layer 40 may be formed by, for example, spin coating.

A fourth opening H4 may be formed by etching parts of the fourth insulating layer 40 and the third insulating layer 30 in an area corresponding to the first opening H1. The fourth opening H4 may expose part of the first electrode 140 therethrough. The first opening H1 may be formed to be larger than the fourth opening H4 to prevent misalignment. Alternatively, the first opening H1 and the fourth opening H4 may be formed to share the same etching surface together.

Figure 13:
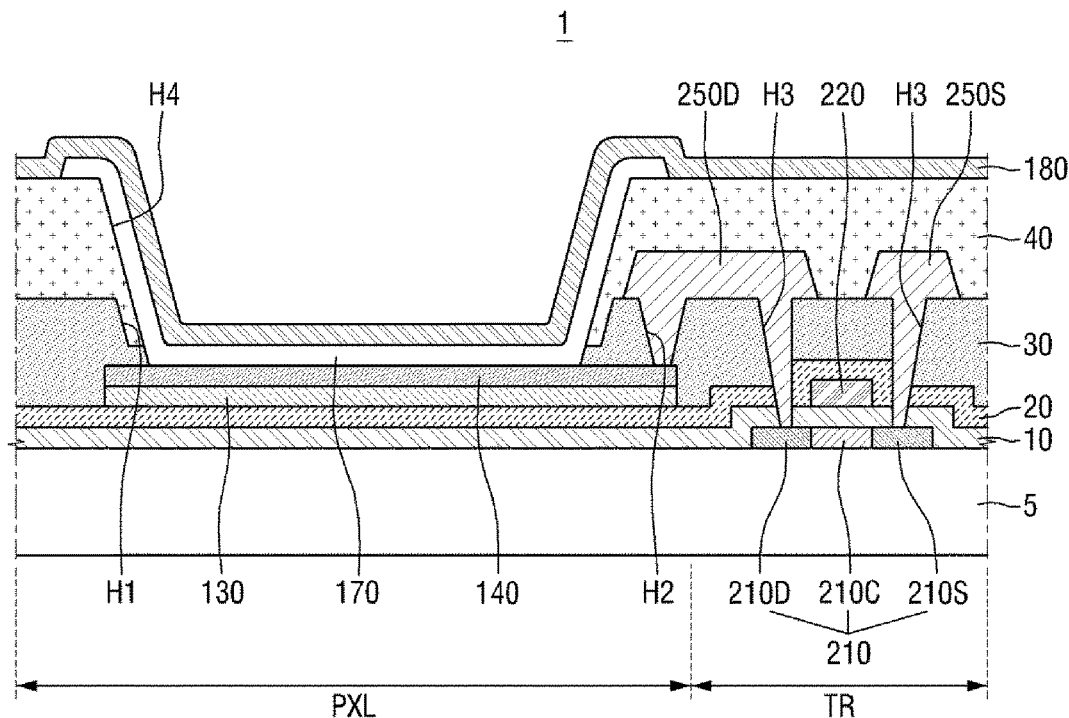

Referring to FIG. 13, an organic light-emitting layer 170 may be formed on part of the first electrode 140 exposed through the fourth opening H4, and a second electrode 180 may be formed on the organic light-emitting layer 170, thereby forming an OLED display device 1.

The second electrode 180 may be formed of a low-resistance metal such as Ag, Al, Mg, Li, Ca, Pt, Pd, Au, Ni, Nd, Ir, Cr, LiF/Ca, LiF/Al, and/or a mixture thereof. By forming the second electrode 180 as a reflective electrode, light emitted from the organic light-emitting layer 170 may be directed toward the substrate 5.

In the exemplary embodiment of FIGS. 4 to 13, since the transflective layer 130 is formed of the same silicon-based material as the second insulating layer 20, the ease of processing and productivity may be improved. Also, since the transflective layer 130 is formed of a material with a relatively large difference in refractive index with the first electrode 140, a stable resonance structure may be formed, and thus, optical efficiency may be improved.

FIGS. 14 to 18 are cross-sectional views illustrating a method of manufacturing an OLED display device, according to another exemplary embodiment of the invention. The method of manufacturing an OLED display device, according to another exemplary embodiment of the invention, will hereinafter be described with reference to FIGS. 14 to 18 and with further reference to FIGS. 1, 3, and 4 to 13.

Figure 14:
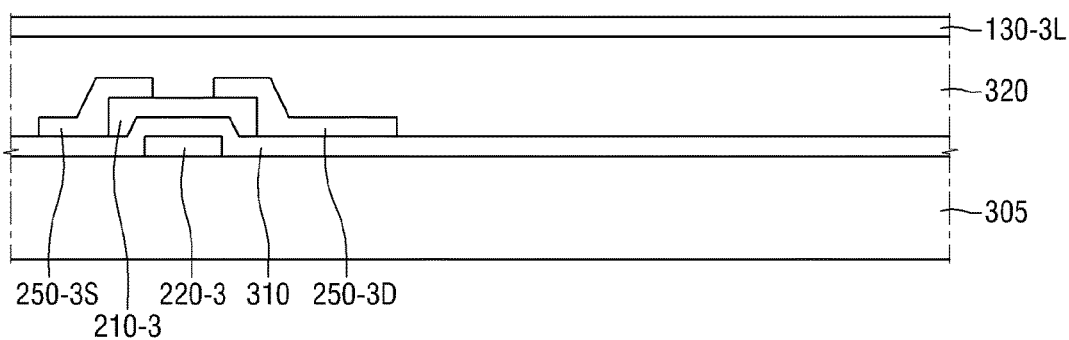
FIGS. 14, 15, 16, 17, and 18 are cross-sectional views illustrating a method of manufacturing an OLED display device, according to another exemplary embodiment.

Referring to FIG. 14, a transistor device may be formed in a transistor region TR on a substrate 305.

The transistor device in the transistor region TR may include a gate electrode 220-3, which is formed on the substrate 305. A gate insulating layer 310, which may insulate the gate electrode 220-3, may be formed on an entire surface of the substrate 305 where the gate electrode 220-3 is formed.

An active layer 210-3 may be formed on the gate insulating layer 310. The active layer 210-3 may be disposed to overlap at least part of the gate electrode 220-3.

A source electrode 250-3S and a drain electrode 250-3D may be formed on the substrate 305 where the active layer 210-3 is formed. The source electrode 250-3S and the drain electrode 250-3D may be formed to at least partially the active layer 210-3. Alternatively, the source electrode 250-3S and the drain electrode 250-3D may be formed such that the entire bottom surfaces of the source electrode 250-3S and the drain electrode 250-3D may overlap the active layer 210-3.

By forming the source electrode 250-3S and the drain electrode 250-3D on the gate electrode 220-3, a transistor device may be formed. A passivation layer 320 may be disposed to protect the transistor device. A transflective material layer 130-3L may be formed on the passivation layer 320.

The transflective material layer 130L may be formed on the passivation layer 320, consecutively following the formation of the passivation layer 320. The passivation layer 320 may be formed as a single- or multilayer structure including $SiO_2$, SiNx, or a combination thereof. The transflective material layer 130-3L may be formed of a silicon-based material including one of SiC, a-Si, p-Si, and a combination thereof.

For example, the second insulating layer 20 may be formed in a single chamber under a nitrogen or oxygen atmosphere, and an a-Si layer for forming the transflective material layer 130-3L may be formed in the chamber by changing the atmosphere inside the chamber into a hydrogen atmosphere.

The transflective material layer 130-3L may be formed on the second insulating layer 20 to have a thickness of 50 Å to 200 Å. For example, the transflective material layer 130-3L may be formed of a-Si to have a thickness of 50 Å to 200 Å, thereby addressing the problem in comparative embodiments of a thick a-Si layer appearing reddish.

The second insulating layer 20 and the transflective material layer 130-3L may be consecutively formed in a single chamber. Accordingly, the formation of a transflective layer 130-3 may be simplified, and productivity may be improved compared to comparative embodiments. Also, since the transflective material layer 130-3L is formed of the same silicon-based material as the second insulating layer 20, the bonding stress between the second insulating layer 20 and the transflective layer 130-3L may be alleviated. The transflective material layer 130-3L may be formed of a material with a relatively large difference in refractive index with a transparent material layer 140L, which is to be formed on the transflective material layer 130L.

Figure 15:
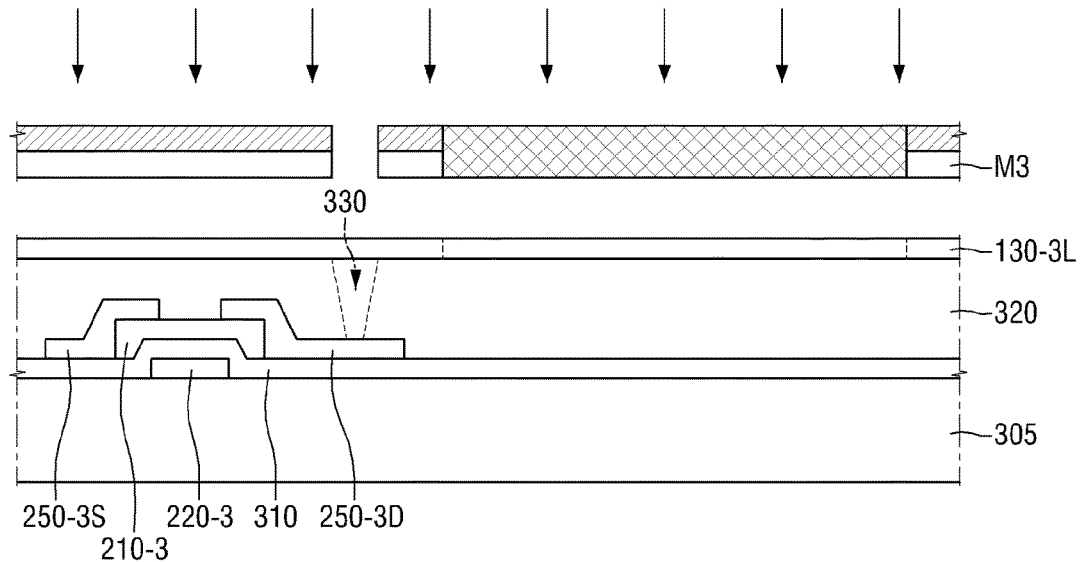

Referring to FIG. 15, a halftone mask M3 may be used to form the transflective layer 130-3. The halftone mask M3 may include a light-transmitting portion, a semi-light-transmitting portion and a light-blocking portion. More specifically, the halftone mask M3 may be disposed such that the light-transmitting portion may correspond to an area in which to form a contact hole 330, the light-blocking portion may correspond to an area in which the transflective layer 130-3 is formed and the semi-light-transmitting portion may correspond to the rest of the substrate 305.

The semi-light-transmitting portion may be selectively provided in the halftone mask M3 in consideration that the transflective material layer 130-3L can be etched away by plasma damage scattered during a dry etching process. Since the contact hole 330 and the transflective layer 130-3 are formed by using a single mask, the formation of the transflective layer 130-3 may be simplified.

Figure 16:
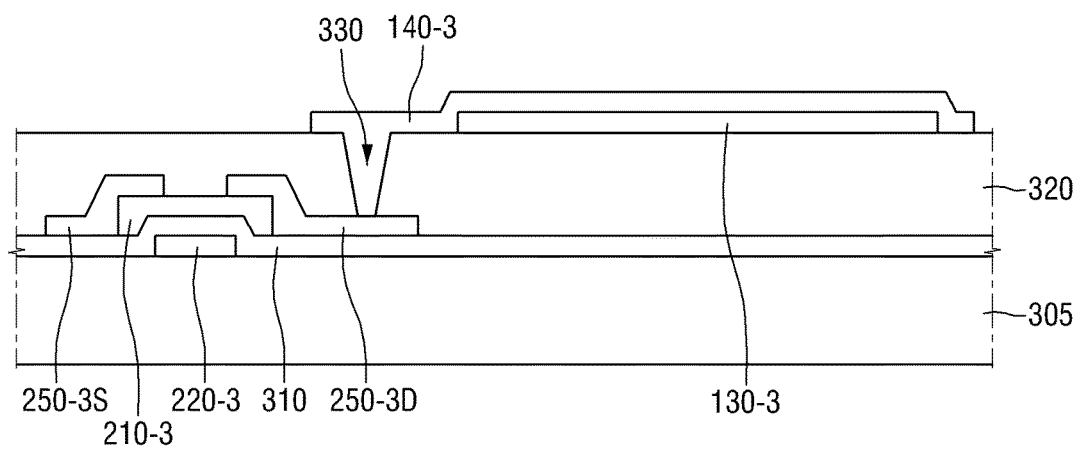

Referring to FIG. 16, a first electrode material is formed on the passivation layer 340 where the transflective layer 130-3 and the contact hole 330 are formed, and a first electrode 140-3 may be formed by patterning the first electrode material. The first electrode 140-3 may be formed to completely cover the transflective layer 130-3.

The first electrode 140-3 may be electrically connected to the drain electrode 250-3D of the transistor device via the contact hole 330.

The first electrode 140-3 may be formed to a thickness of 50 Å and 100 Å. Accordingly, a thin-shaped OLED display device 3 may be realized.

Figures 17, 18:
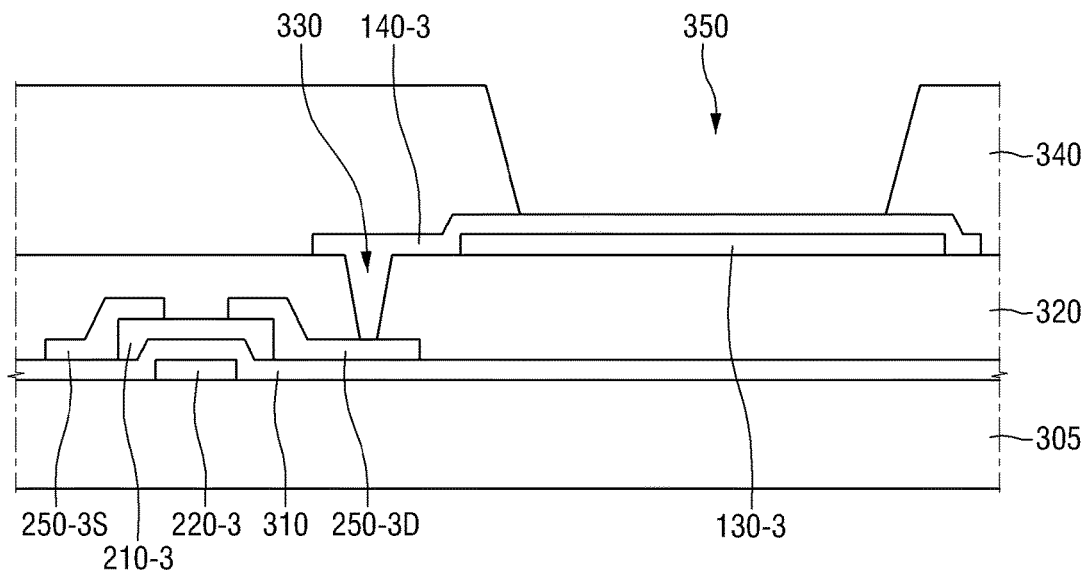

Referring to FIG. 17, a PDL 340 may be formed on the substrate 305 where the first electrode 140-3 is formed. An opening 350 may be formed on the PDL 340 to expose part of the first electrode 140-3 therethrough.

Referring to FIG. 18, an organic light-emitting layer 170-3 may be formed on part of the first electrode 140-3 exposed through the opening 350.

A second electrode 180-3 may be formed on the organic light-emitting layer 170-3. The second electrode 180-3 may be formed of a low-resistance metal with reflective properties.

In the exemplary embodiment of FIGS. 14 to 18, since the transflective layer 130-3 is formed of the same material(s) as the passivation layer 320, the adhesion between the transflective layer 130-3 and the passivation layer 320 may be improved, and productivity may also be improved.

According to the exemplary embodiments, a thin OLED display device may be formed. According to the exemplary embodiments, efficiency of production may be improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light-emitting diode (OLED) display device, comprising:
   a substrate;
   a transistor device disposed on the substrate;
   a first electrode electrically connected to the transistor device;
   an organic light-emitting layer disposed on the first electrode;
   a second electrode disposed on the organic light-emitting layer; and
   a transflective layer contacting a lower surface of the first electrode and having a higher refractive index than the first electrode,
   wherein the transflective layer comprises at least one material selected from the group consisting of amorphous silicon (a-Si), polycrystalline silicon (p-Si), and silicon carbide (SiC).

2. The OLED display device of claim 1, wherein the refractive indexes of the transflective layer and the first electrode have a difference of 0.5 or greater.

3. The OLED display device of claim 1, wherein the transflective layer comprises a material having a refractive index of 2.5 or higher.

4. The OLED display device of claim 1, wherein the transflective layer has a thickness of 50 Å to 200 Å.

5. The OLED display device of claim 1, wherein the first electrode has a thickness of 50 Å to 100 Å.

6. The OLED display device of claim 1, further comprising:
   a transparent layer disposed on a lower surface of the transflective layer.

7. The OLED display device of claim 6, wherein the transparent layer comprises a same material or materials as the first electrode.

8. The OLED display device of claim 6, wherein the transparent layer comprises at least one material selected from the group consisting of indium tin oxide (ITO), tin oxide (SnO), indium zinc oxide (IZO), zinc oxide (ZnO), indium oxide ($In_2O_3$), indium gallium oxide (IGO), aluminum zinc oxide (AZO), and zinc gallium oxide (GZO).

* * * * *